(12) United States Patent
Johnson et al.

(10) Patent No.: US 6,449,523 B1
(45) Date of Patent: Sep. 10, 2002

(54) FEEDER/PROGRAMMING/BUFFER OPERATING SYSTEM

(75) Inventors: Bradley Morris Johnson, Edmonds; Lev M. Bolotin; Simon B. Johnson, both of Kirkland; Carl W. Olson, Renton; Bryan D. Powell, Maple Valley; Janine Whan-Tong, Woodinville, all of WA (US)

(73) Assignee: Data I/O Corporation, Redmond, WA (US)

( * ) Notice: Subject to any disclaimer, the term of this patent is extended or adjusted under 35 U.S.C. 154(b) by 0 days.

(21) Appl. No.: 09/419,172

(22) Filed: Oct. 15, 1999

(51) Int. Cl.[7] .............................................. G06F 19/00
(52) U.S. Cl. ...................................... 700/121; 700/219
(58) Field of Search ................................ 700/121, 213, 700/219, 86, 220; 414/273

(56) References Cited

U.S. PATENT DOCUMENTS

| 4,675,993 A | | 6/1987 | Harada ......................... 29/740 |
| 4,917,556 A | * | 4/1990 | STark et al. ................. 414/217 |
| 6,082,950 A | * | 7/2000 | Altwood et al. ............. 414/217 |
| 6,229,323 B1 | * | 5/2001 | Tverdy et al. ............... 324/758 |
| 6,241,459 B1 | * | 6/2001 | Canella et al. ........... 414/798.1 |

FOREIGN PATENT DOCUMENTS

EP    0 517 439 A1   5/1992   .......... H05K/13/02

OTHER PUBLICATIONS

BP–6500 In–Line Programming System brochure, BP Microsystems, Inc. 1999, 2 pages.
BP–6500 In–Line Programming System Data Sheet, BP Microsystems, Inc. 1999, 1 page.
"BP–6500 In–Line Programming & Fifth Generation Technology", BP Microsystems, Inc. 1999, 7 pages.

* cited by examiner

*Primary Examiner*—Paul P. Gordon
(74) *Attorney, Agent, or Firm*—Mikio Ishimaru

(57) ABSTRACT

A feeder/programming/buffer operating system is provided which controls a feeder mechanism, a programming mechanism, an electronic handling mechanism, a pneumatic handling mechanism, and a plurality of sensors. The operating system programs programmable devices and makes the feeder/programming/buffer system substantially independent of a production assembly system with which it is capable of being integrated yet fully responsive to the requirements of the production assembly system.

30 Claims, 3 Drawing Sheets

FEEDER/PROGRAMMING/BUFFER OPERATING SYSTEM

CROSS-REFERENCE TO RELATED APPLICATION(S)

The present application contains subject matter related to a concurrently filed U.S. Patent Application by Lev M. Bolotin entitled "MANUFACTURING SYSTEM WITH FEEDER/PROGRAMMING/BUFFER SYSTEM". The related pending application is assigned to Data I/O Corporation, is identified by Ser. No. 09/418,732, and is hereby incorporated by reference.

The present application also contains subject matter related to a concurrently filed U.S. Patent Application by Simon B. Johnson, George L. Anderson, Lev M. Bolotin, Bradley M. Johnson, Mark S. Knowles, Carl W. Olson, and Vincent Warhol, entitled "FEEDER/PROGRAMMING/ BUFFER CONTROL SYSTEM AND CONTROL METHOD". The related pending application is assigned to Data I/O Corporation, is identified by Ser. No. 09/418,901, and is hereby incorporated by reference.

The present application further contains subject matter related to a concurrently filed U.S. patent application by Lev M. Bolotin entitled "MANUFACTURING AND CARRIER SYSTEM WITH FEEDER/PROGRAMMING/BUFFER SYSTEM". The related pending application is assigned to Data I/O Corporation, is identified by Ser. No. 09/419,162, and is hereby incorporated by reference.

TECHNICAL FIELD

The present invention relates generally to a manufacturing system for electronic products, and more particularly to continuous production of electronic circuit boards incorporating programmable integrated circuits.

BACKGROUND ART

In the past, certain operations of electronic circuit board assembly were performed away from the main production assembly lines. While various feeder machines and robotic handling systems would populate electronic circuit boards with integrated circuits, the operations related to processing integrated circuits, such as programming, testing, calibration, and measurement were performed in separate areas on separate equipment rather than being integrated into the main production assembly lines.

For example, in the programming of programmable devices such as electrically erasable programmable read-only memories (EEPROMs) and Flash EEPROMs, separate programming equipment was used which was often located in a separate area from the circuit board assembly lines. There were a number of reasons why programming was done off-line.

First, the programming equipment was relatively large and bulky. This was because of the need to accurately insert and remove programmable devices at high speeds into and out of programming sockets in the programmer. Since insertion and removal required relatively long traverses at high speed and very precise positioning, very rigid robotic handling equipment was required. This rigidity requirement meant that the various components had to be relatively massive with strong structural support members to maintain structural integrity and precision positioning of the pick and place system moving at high speeds. Due to the size of the programming equipment and the limited space for the even larger assembly equipment, they were located in different areas.

Second, a single high-speed production assembly system could use up programmed devices faster than they could be programmed on a single programming mechanism. This required a number of programming systems which were generally operated for longer periods of time in order to have a reserve of programmed devices for the production assembly systems. This meant that the operating times and the input requirements were different between the two systems.

Third, no one had been able to build a single system which could be easily integrated with both the mechanical and electronic portions of the production assembly systems. These systems are complex and generally require a great deal of costly engineering time to make changes to incorporate additional equipment.

A major problem associated with programming the programmable devices in a separate area and then bringing the programmed devices into the production assembly area to be inserted into the electronic circuit boards was that it was difficult to have two separate processes running in different areas and to coordinate between the two separate systems. Often, the production assembly line would run out of programmable devices and the entire production assembly line would have to be shut down. At other times, the programming equipment would be used to program a sufficient inventory of programmed devices to assure that the production assembly line would not be shut down; however, this increased inventory costs. Further problems were created when the programming had to be changed and there was a large inventory of programmed integrated circuits on hand. In this situation, the inventory of programmable devices would have to be reprogrammed with an accompanying waste of time and money.

While it was apparent that a better system would be desirable, there appeared to be no way of truly improving the situation. There were a number of apparently insurmountable problems that stood in the way of improvement.

First, the operating speeds of current production assembly lines so greatly exceeded the programming speed capability of conventional programmers that the programmer would have to have a much greater throughput than thought to be possible with conventional systems.

Second, not only must the programmer be faster than existing programmers, it would also have to be much smaller. The ideal system would integrate into a production assembly line, but would do so without disturbing an existing production assembly line or requiring the lengthening of a new production assembly line over that of the length without the ideal system. Further, most of these production assembly lines were already filled with, or designed to be filled with, various types of feeding and handling modules which provide limited room for any additional equipment.

Third, any programmer integrated with the production assembly line would apparently also have to interface with the control software and electronics of the production system software for communication and scheduling purposes. This would be a problem because production assembly line system software was not only complex, but also confidential and/or proprietary to the manufacturers of those systems. This meant that the integration must be done with the cooperation of the manufacturers, who were reluctant to spend engineering effort on anything but improving their own systems, or must be done with a lot of engineering effort expended on understanding the manufacturers' software before working on the programmer's control software.

Fourth, the mechanical interface between a programmer and the production equipment needed to be highly accurate for placing programmed devices relative to the pick-and-place handling equipment of the production assembly system.

Fifth, there are a large number of different manufacturers of production handling equipment as well as production manufacturing equipment. This means that the a large number of different production assembly line configurations would have to be studied and major compromises in design required for different manufacturers.

Sixth, the ideal system would allow for changing quickly between different micro devices having different configurations and sizes.

Seventh, the ideal system needed to be able to accommodate a number of different micro device feeding mechanisms including tape, tape stacker, tube, tube stacker, and tape and reel.

Finally, there was a need to be able to quickly reject micro devices which failed during the programming.

All the above problems seemed to render an effective solution impossible. Of particular difficulty was the inability to build a single system that could be easily integrated with both the mechanical and electronic portions of the production assembly systems. Production assembly systems are complex and generally require a great deal of costly engineering time to make changes to incorporate additional equipment.

DISCLOSURE OF THE INVENTION

The present invention provides a feeder/processing/buffer operating system which controls a feeder mechanism, a processing mechanism, an electronic handling mechanism, a pneumatic handling mechanism, and a plurality of sensors to make the feeder/processing/buffer system substantially independent of a production assembly system yet fully responsive to the production assembly system. The system solves most of the problems previously occurring with production assembly line equipment integration while being optimized to provide efficient operation of the overall system.

The present invention provides a feeder/processing/buffer operating system which controls a feeder mechanism, a processing mechanism, an electronic handling mechanism, a pneumatic handling mechanism, and a plurality of sensors to make the feeder/processing/buffer system which is substantially fail-safe. The system solves most of the problems previously occurring with production assembly line equipment safety concerns while being optimized to provide efficient operation of the overall system.

The present invention provides a feeder/programming/buffer operating system which controls a feeder mechanism, a programming mechanism, an electronic handling mechanism, a pneumatic handling mechanism, and a plurality of sensors to make the feeder/programming/buffer system substantially independent of the production assembly system yet fully responsive to the production assembly system. The system solves most of the problems previously occurring with production assembly line equipment integration while being optimized to provide efficient operation of the overall system.

The present invention provides a feeder/programming/buffer operating system which controls a feeder mechanism, a programming mechanism, an electronic handling mechanism, a pneumatic handling mechanism, and a plurality of sensors to make the feeder/processing/buffer system which is substantially fail-safe. The system solves most of the problems previously occurring with production assembly line equipment safety concerns while being optimized to provide efficient operation of the overall system.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
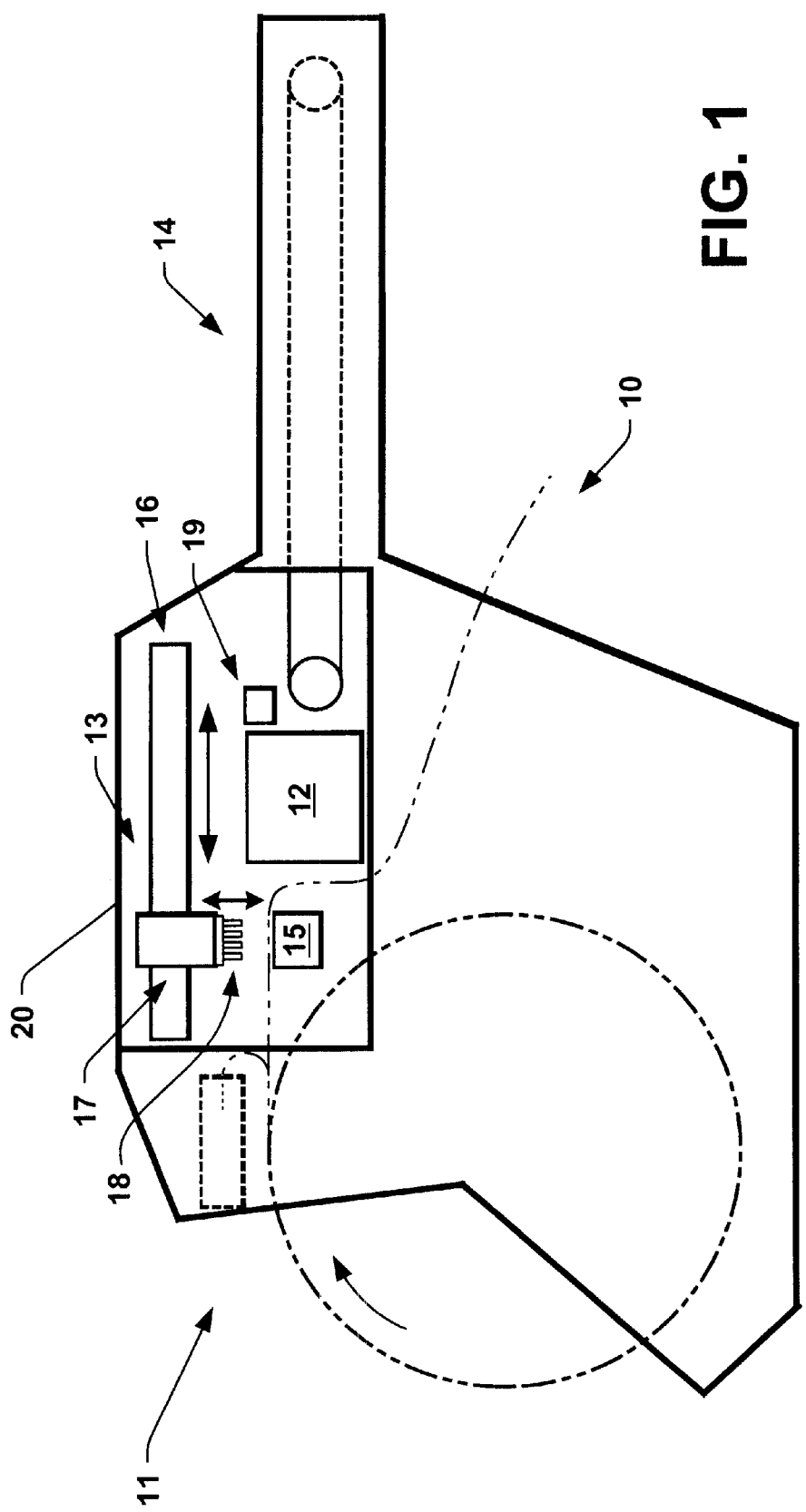
FIG. 1 is a schematic of a feeder/programming/buffer system of the present invention.

Organization:

Referring now to FIG. 1, therein is shown a feeder/programming/buffer system 10. The feeder/programming/buffer system 10 consists of an input feeder mechanism 11 for providing unprogrammed electronic devices (not shown), a programming mechanism 12 for programming the devices, a robotic handling system 13 for manipulating the devices in the system both before and after programming, and an output buffer mechanism 14 for presenting the programmed devices for an assembly system (not shown). The input feeder mechanism 11 has a takeup mechanism 15, and the robotic handling system 13 has a linear stage 16 and a vertical stage 17 for respective horizontal and vertical movement of programmable devices. The vertical stage 17 has pneumatic pick and place (PNP) probes 18 which provide vertical movement for picking up and placing programmable devices. A reject bin 19, which must be periodically emptied, is provided for rejected programmable devices.

Certain of the operational portions of the above mechanisms and systems are visible through a transparent cover 20. The feeder/programming/buffer system 10 is described in greater detail in the Bolotin applications, supra., but any system having similar mechanisms for performing similar functions could incorporate the present invention.

Figure 2:
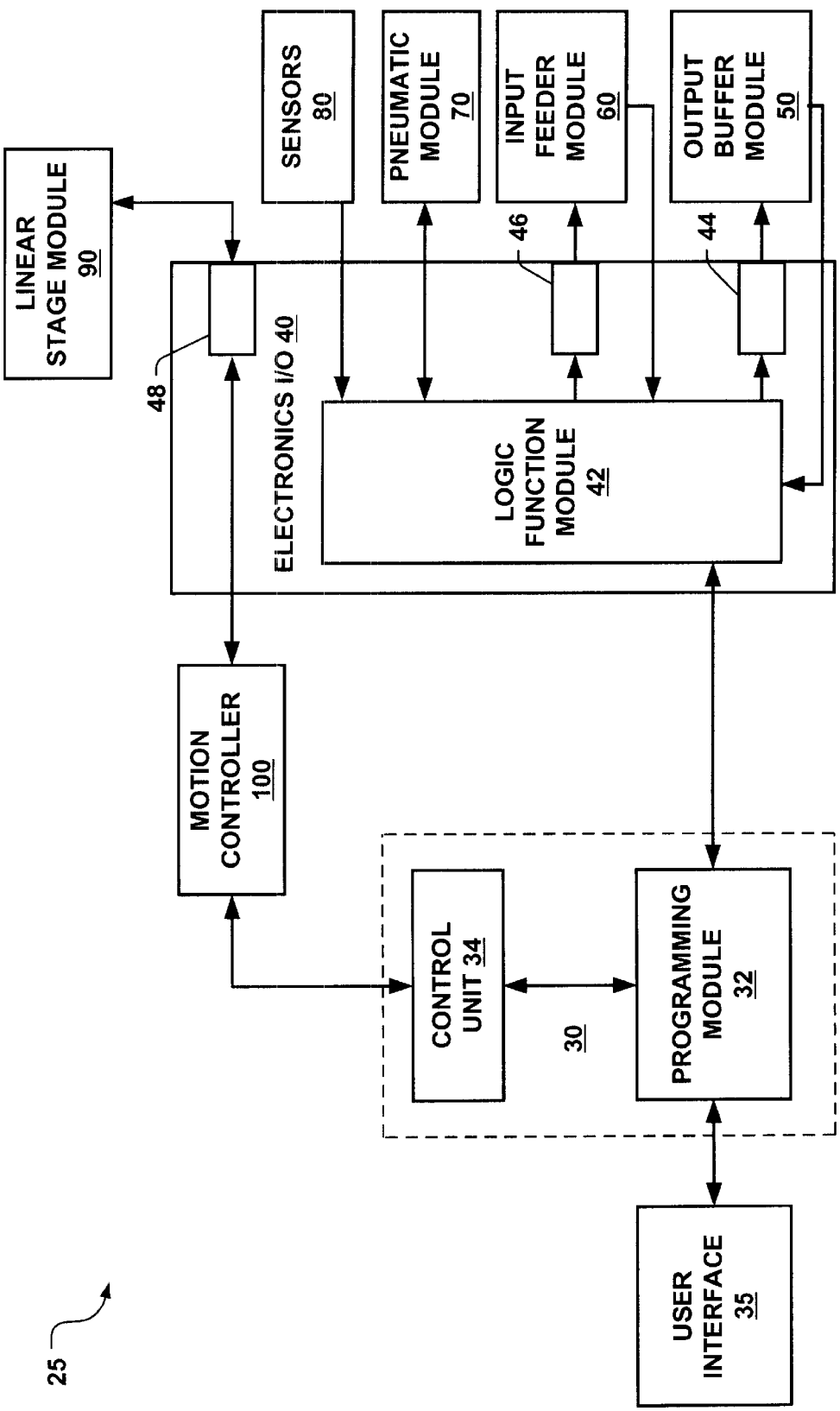
FIG. 2 is an overall block diagram of the control system of the present invention.

Referring now to FIG. 2, therein is shown a feeder/programming/buffer operating system 25 having a control system 30 which contains a programming module 32 and a control unit 34. The control unit 34 is connected to a user interface 35 which is for displaying and receiving information to and from a user through the programming module 32.

The function of the user interface 35 is to provide the user with information about the operation of the feeder/programming/buffer system 10 and to allow the user to input information which is used in its operation. To provide information to the user, there is a visual display, information entry buttons, an emergency stop button and a three light display (none shown). The user interface 35 writes to and from the control unit 34 through the programming module 32.

The programming module 32 is connected to an electronics input/output (I/O) 40 which centralizes the electronic connections for the feeder/programming/buffer system 10. The electronics I/O 40 contains a logic function module 42 which provides control signals through an amplifier 44 to an output buffer module 50 which controls the operations of the output buffer mechanism 14. The output buffer module 50 provides feedback to the logic function module 42.

The logic function module 42 further provides control signals through an amplifier 46 to an input feeder module 60 which controls the operations of the input feeder mechanism 11. The input feeder module 60 also has feedback to the logic function module 42.

The electronics I/O 40 is connected to a pneumatic module 70 which is part of the robotic handing system 12. Various sensors 80 are also connected to the electronics I/O 40. These sensors 80 detect various operational and failure modes which are necessary for operation of the feeder/programming/buffer operating system 25. A linear stage module 90 is connected between the control unit 34 and the electronics I/O 40. The linear stage module 90 is powered through an amplifier 48 controlled by a motion controller 100 which is responsible for all linear horizontal motion of devices; i.e., the motion from the input feeder mechanism 11, to the programming mechanism 12, and to the output buffer mechanism 14.

Figure 3:
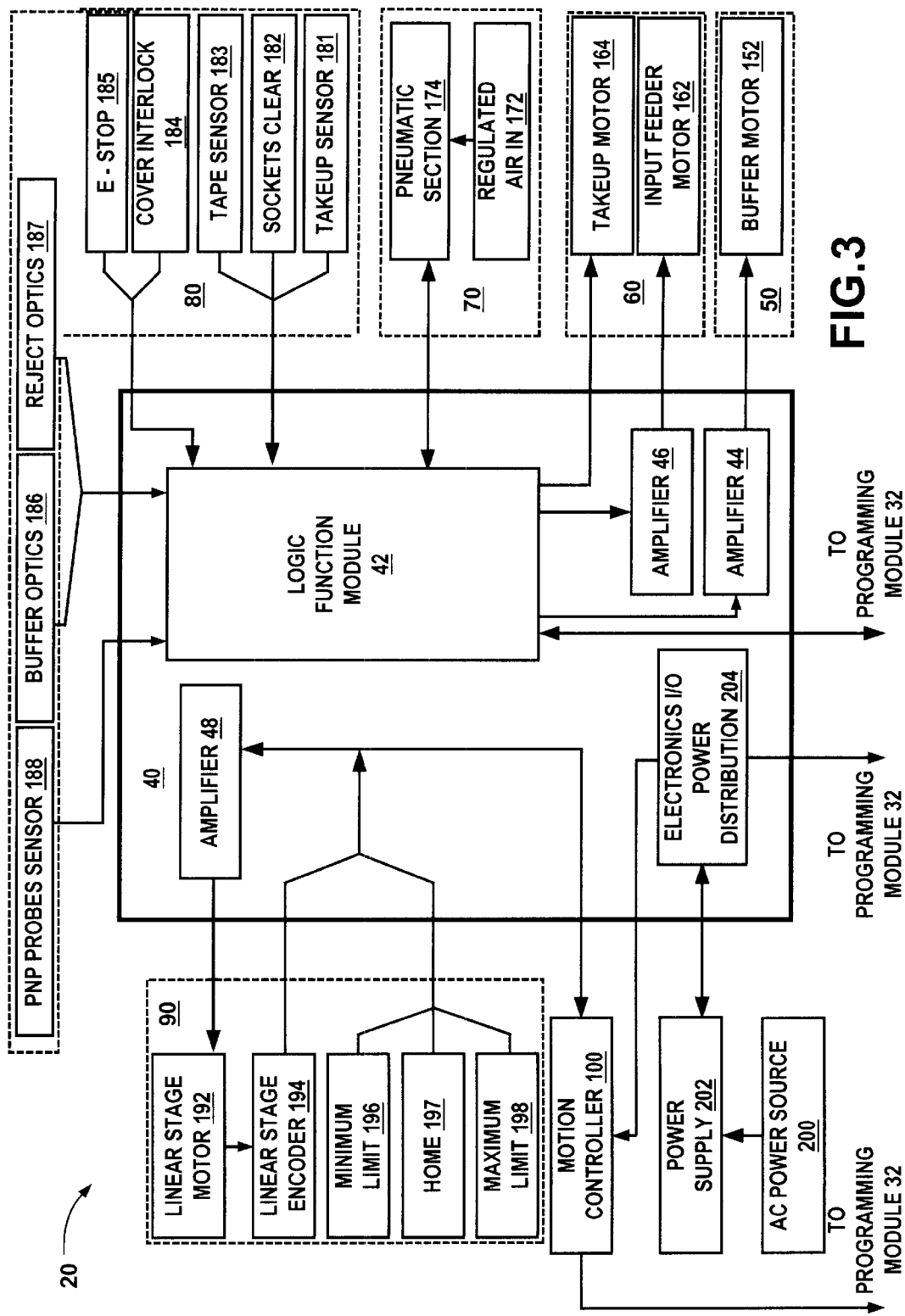
FIG. 3 is a detailed block diagram of the control system of the present invention.

Referring now to FIG. 3, therein is shown a more detailed schematic of the feeder/programming/buffer operating system 25 of the present invention. The output buffer module 50 for the output buffer mechanism 14 includes a buffer motor 152 which is powered through the amplifier 44 which provides very fine control of the buffer motor 152. Feedback for the buffer motor 152 is provided by the sensors 80 as will hereinafter be described. The output buffer mechanism 14 can be any mechanism that has the capability of temporarily storehousing devices after they are programmed and before they are used by the assembly system. For example, a conveyor belt system can be used in which case the buffer motor 152 would drive the conveyor belt. If the system utilized a rotary pickup system, the buffer motor 152 would drive a rotary buffer pickup.

The input feeder module 60 for the input feeder mechanism 11 includes a feeder motor 162 which provides feedback through the sensors 80 as will hereinafter be described and a take-up motor 164. The input feeder mechanism 11 can be any mechanism that has the capability of supplying devices. These mechanisms include tape, tape stacker, tube, tube stacker, and tape and reel. For example, an device carrying tape could be used in which case the feeder motor 162 would drive a takeup sprocket for the tape. If the system utilized a rotary feed system, the feeder motor 162 would drive a rotary feeder pickup.

The pneumatics module 70 includes a sensor for regulated air-in 172 and a pneumatic section 174 for controlling and sensing the pneumatic valves for the pneumatic system. The sensor for regulated air-in 172 assures that there is sufficient air pressure to provide vacuum where required and positive release pressure to the robotic handling system 13. The pneumatic section 174 is controlled directly from the logic function module 42 and activates and deactivates of the vertical stage 17 as well as sensing proper operation of the pneumatic system. The vertical stage 17 could incorporate a number of different mechanisms. In the best mode, the vertical stage 17 could be actuated in the vertical direction by an air cylinder with a spring return which has the capability of picking up devices using the suction PNP probes 18. A vacuum is applied to pick up a programmable device and a positive pulse of air used to release the programmable device.

The sensors 80 include a number of different sensors which operate with other modules in the feeder/programming/buffer operating system 25 to assure proper operation. A takeup sensor 181, sockets clear 182, and tape sensor 184 sensors are connected to the logic function module 42. The takeup sensor 181 senses the operation of the input feeder mechanism 11. For example, where the input feeder mechanism 15 uses a tape and reel, a takeup motor 164 would be sensed to determine if there has been sufficient movement to bring the unprogrammed devices close enough to the robotic handling system 13 to be picked up and inserted in the programming mechanism 12. Since the tape off the reel has a relatively strong device carrying bottom tape and a relatively weak cover tape, the tape sensor 183 monitors the cover tape to make sure it is not broken or severed. The sockets clear 182 sensor senses if sockets for the devices can accept or release programmable devices.

Also in the sensors 80 are a cover interlock 184 and E-stop 185 sensors which are connected to the logic function module 42 and through to the programming module 32 and to the user interface 35. The cover interlock 184 places the control system 30 into a slow motion or maintenance mode when the transparent cover 20 is removed. The emergency stop or E-stop 185 stops the feeder/programming/buffer operating system 25 under user command or if a condition occurs under which an emergency stop should be performed.

Also a part of the sensors 80, are buffer optics 186 and reject optics 187. Buffer optics 186 operates to provide feedback on the buffer motor 152 to the logic function module 42. The reject optics 187 are optical sensors which operate with the programming module 32 to indicate when the reject bin 19 is full.

Further, a PNP probe sensor 188 in the sensors 80 is connected to the logic function module 42 to provide information that there are no programmable devices on the PNP probes 18. The PNP probe sensor 188 monitors the vacuum applied to the PNP probes 18.

A motion controller 100 controls a linear stage motor 192 which is powered through the amplifier 48. A number of different mechanisms can provide the linear motion for the linear stage 16. For example, a ball screw may be used. The screw would be turned by a rotary motor which is designated as a linear stage motor 192 and the amount of the horizontal traverse of the vertical stage 17 is determined by the motion of a linear stage encoder 194 operatively connected to the linear stage motor 192. The limit of movement is accomplished by sensing minimum limit 196, home 197, and maximum limit 198. The minimum limit 196 and the maximum limit 198 may be set by conventional limit switches, and the home 197, which is the starting position, may be a conventional location sensor. One indicates maximum travel which is just before a hard stop, one is for minimum travel which is in the opposite direction just before the hard stop, and one is for a home stop which generates a zero-point for all motion.

Input power to the electronic system is through an AC power source 200 to an internal power supply 202 which transforms the AC into lower voltage DC for the electronics I/O power distribution 204 to all the electronic modules, sensors, and motors.

Operation:

The functionality of the electronics I/O 40 of FIG. 2 is twofold. One is to provide an interconnect between the linear stage module 90 and the various sensors 80 and the motion controller 100. The second function of the electronics I/O 40 is to provide an interface to the various components controlled by the control unit 34.

The logic function module 42 provides the interface to the control unit 34. It allows the control unit 34 to read or write values to the sensors 80, to the pneumatic module 70, and to the input feeder module 60. The input feeder module 60, the pneumatic module 70, and the sensors 80 receive information from the control unit 34 directly through the logic function module 42 which also contains the logic for the output buffer module 50.

The buffer motor 152 in the output buffer module 50 has two modes of operation. One is under the control of the control unit 34 in a manual/maintenance, slow motion mode and the other is in an automatic operation mode. The logic function module 42 provides the necessary logic to drive the buffer motor 152 of FIG. 3 in the output buffer module 50 until the buffer optics 186 in the sensors 80 detect an device at a delivery point on the output buffer mechanism 14. When there is an device at the delivery point, the buffer motor 152 is turned off.

The autonomous operation mode frees CPU time so that the control unit 34 can have enough time to have the programming module 32 do the programming and not have the burden and overhead of driving the output buffer module 50. In the autonomous mode, the logic function module 42 completely controls the output buffer module 50 and no overhead from the control unit 34 is required. The logic function module 42 drives the input feeder motor 162 in the input feeder mechanism 11 through the amplifier 46.

In the best mode, the input feeder mechanism 11 uses a tape feed having a cover and support portions where the devices are on the support portion and are held in place by the cover portion. The input feeder motor 162 drives the tape of the input feeder mechanism 11 to bring an unprogrammed device to a particular pick point for the robotic handling system 13 to be able to pick from. The proper location of the unprogrammed device is sensed by the takeup sensor 181.

The number of programmable devices presented and the space for them under the robotic handling system 13 is a function of the desired throughput of the feeder/programming/buffer system 10. In the best mode, the input feeder mechanism 11 resents one unprogrammed device at a time to the robotic handling system 13 but the four PNP probes 18 sequentially pick up four unprogrammed devices in one large movement of the linear stage 16 under the control of the motion controller 100. The distance of traverse is sensed by the linear stage encoder 194.

The pneumatic module 70 is responsible for probe actuation in the robotic handling system 13. The PNP probes 18 are rubber-tipped, hollow tubes to which a vacuum is applied to pick up the unprogrammed devices from the input feeder mechanism 11. A pneumatic cylinder (not shown) which is spring loaded to an up position, is deactivated to lift the unprogrammed device while the vacuum is maintained. The vertical stage 17 is successively driven to locations where the pneumatic module 70 can be successively activated to lift the other unprogrammed devices. In the best mode, there are four PNP probes 18. As each unprogrammed device is picked up, the input feeder motor 162 is driven to cause the input feeder mechanism 11 to advance more unprogrammed devices.

The vertical stage 17 carrying the four unprogrammed devices is then moved to over the programming mechanism 12 by the linear stage 16 for sequential placement of the four unprogrammed devices into the sockets of the programming mechanism 12. The pneumatic module 70 provides a puff of air for releasing each unprogrammed device. It should be noted as both a safety feature and a product feature that the pneumatic module 70 operates in a fail-safe mode in which the vacuum is maintained even when power is lost. This is to insure that programmable devices are not dropped in the event of a power failure.

When the four unprogrammed devices are properly positioned, they are programmed by the programming module 32. If one or more unprogrammed devices fail to be programmed, they are rejected and this will be noted by the programming module 32 and the control unit 34.

When programming is complete, the vertical stage 17 and the linear stage 16 will sequentially pick up each of the four programmed devices from the programming mechanism 12. The linear stage 16 will be moved over a reject bin 19 where a rejected device will be dropped. The reject optics 186 will sense and provide a warning when the reject bin 19 is full.

The "good" programmed devices will be delivered by the robotic handling system 13 to the output buffer mechanism 14. The output buffer mechanism 14 provides a temporary storage, or "buffer" area, to hold programmed devices before they are picked up from the pick point by an assembly system (not shown). At a low rate of pickup, the output buffer mechanism 14 will be advancing programmed devices in steps. At a high rate of pickup, the output buffer mechanism 14 will be advancing programmed devices continuously.

The output buffer module 50 responds to two sets of sensors in the buffer optics 186 which detect the presence of programmed devices. To avoid excessive movement of the programmed device when it is on output buffer mechanism 14 as it starts or stops, there is a speed sensor which allows the movement of the programmed devices a long distance at a high rate of speed and then changes the output buffer mechanism 14 speed to a low rate of speed so that stopping and starting do not jostle the programmed devices. The feeder/programming/buffer system 10 contiuously provides a programmed device when the buffer optics 186 in the sensors 80 detects that a programmed device has been removed from the output buffer mechanism 14. This allows the feeder/programming/buffer system 10 and 10 the feeder/programming/buffer operating system 25 to operate as a plug and play, on demand supply system.

The sensors 80 are responsible for providing a means for the control unit 34 to read the various sensor states. The sensors 80, as previously described, include indications of a broken cover tape, clear sockets, probes down, emergency stop, and cover removal. The emergency or E-stop 185 alerts the control unit 34 that power to amplifiers 44 and 48 has been removed to prevent motor operation.

From the above it will be understood that the present invention is applicable to what can be described as "micro devices". Micro devices include a broad range of electronic and mechanical devices. The best mode describes processing which is programming for programmable devices, which include but are not limited to devices such as Flash memories (Flash), electrically erasable programmable read only memories ($E^2$PROM), programmable logic devices (PLDs), field programmable gate arrays (FPGAs), and microcontrollers. However, the present invention encompasses processing for all electronic, mechanical, hybrid, and other devices which require testing, measurement of device characteristics, calibration, and other processing operations. For example, these types of micro devices would include but not be limited to devices such as microprocessors, integrated circuits (ICs), application specific integrated circuits (ASICs), micro mechanical machines, micro-electromechanical (MEMs) devices, micro modules, and fluidic systems.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. An electronic system for an automated processing system having an input mechanism for feeding unprocessed micro devices, a processing mechanism for processing unprocessed micro devices, an output mechanism for outputting processed micro devices to a delivery point, and a handling system for moving micro devices from the input mechanism to the processing mechanism to the output mechanism, comprising:

an input module connected to the input mechanism, the input module including an input drive connected to drive the input mechanism to feed the unprocessed micro devices;

an output module connected to the output mechanism, the output module including an output drive connected to drive the output mechanism to output processed micro devices;

an output sensor connected to the output mechanism to sense processed micro devices at the delivery point;

a handling module connected to the handling system, the handling module including a handling drive connected to drive the handling system to move unprocessed micro devices from the input mechanism to the processing mechanism to the output mechanism;

a processing module connected to the processing mechanism, the processing module for processing unprocessed micro devices moved thereto into processed micro devices;

a logic module connected to the input, output, handling, and processing modules and the output sensor, the logic module responsive to the output sensor sensing the absence of a processed micro device at the delivery point to cause:

the input drive to drive the input mechanism to feed the unprocessed micro devices, the output drive to drive the output mechanism to output processed micro devices, the handling drive to drive the handling system to move the unprocessed micro devices from the input mechanism to the processing mechanism, the processing module to process unprocessed micro devices moved to the processing mechanism to become processed micro devices, the handling drive to drive the handling system to move the processed micro devices from the processing mechanism to the output mechanism, and the output drive to drive the output mechanism to move processed micro devices to the delivery point whereby a processed micro device is replaced when a processed micro device is removed from the output mechanism.

2. The electronic system as claimed in claim 1 wherein:
the logic module is responsive to the output sensor sensing the absence of a processed micro device in the output mechanism to cause the output drive to drive the output mechanism to move processed micro devices to the delivery point a distance which varies with the size of the processed micro devices.

3. The electronic system as claimed in claim 1 wherein:
the logic module is responsive to the output sensor sensing the approach of a processed micro device to the delivery point in the output mechanism to cause the output drive to slow the output mechanism to decelerate the processed micro devices.

4. The electronic system as claimed in claim 1 wherein:
the logic module is responsive to the output sensor sensing the absence of a predetermined plurality of processed micro devices in the output mechanism to cause:

the input drive to drive the input mechanism to feed a plurality of unprocessed micro devices, the handling drive to drive the handling system to move the plurality of unprocessed micro devices from the input mechanism to the processing module, the processing module to process the plurality of unprocessed micro devices moved to the processing mechanism, and the handling drive to drive the handling system to move the plurality of processed micro devices from the processing mechanism to the output mechanism whereby the processed micro devices in the output mechanism are buffered.

5. The electronic system as claimed in claim 1 wherein:

the handling system includes a horizontal linear stage for moving unprocessed and processed micro devices linearly and a vertical pneumatic stage for moving unprocessed and processed micro devices vertically;

the handling module includes the handling drive to drive the linear stage and a pneumatic control section to drive the vertical pneumatic stage; and the logic module causes the handling module to cause the handling system to vertically move the unprocessed micro devices from the input mechanism and linearly to the processing mechanism, vertically into the processing mechanism, and move the processed micro devices vertically out of the processing mechanism and linearly to the output mechanism, and vertically into the output mechanism.

6. The electronic system as claimed in claim 5 wherein:

the handling module includes the handling drive to drive the linear stage and handling system sensors connected to the logic module for determining the range of the drive of the linear stage.

7. The electronic system as claimed in claim 1 wherein:
the processing mechanism includes:

a socket for insertion of unprocessed micro devices, and a socket actuator for holding unprocessed micro devices in the socket during processing and releasing processed micro devices after processing;

the processing module includes processing programming to process the unprocessed micro devices in the socket; and the logic module causes the socket actuator to hold and release the unprocessed and processed micro devices, respectively.

8. The electronic system as claimed in claim 1 wherein:
the processing module includes a mechanism for determining when an unprocessed micro device is not processed;

the logic module responsive to an unprocessed micro device not being processed to cause said handling system to eject the unprocessed micro device from the processing mechanism; and the logic module having reject sensors to determine that the unprocessed micro device has been ejected.

9. The electronic system as claimed in claim 1 including:
a user interface for controlling the logic module.

10. The electronic system as claimed in claim 1 including:
a source of electrical power operatively connected to power the input, output, handling, processing, and logic modules, and the output sensor.

11. An electronic system for a feeder/processing/buffer system having an input feeder mechanism for feeding unprocessed micro devices, a processing mechanism for processing unprocessed micro devices, an output buffer mechanism for outputting processed micro devices to a delivery point, and a handling system for moving micro devices from the input feeder mechanism to the processing mechanism to the output buffer mechanism, comprising:

an input feeder module connected input feeder mechanism, the input feeder module including a input feeder motor connected to drive the input feeder mechanism to feed the unprocessed micro devices;

a buffer module connected to the output buffer mechanism, the buffer module including a buffer motor connected to drive the output buffer mechanism to output processed micro devices;

a buffer sensor connected to the output buffer mechanism to sense processed micro devices at the delivery point;

a handling module connected to the handling system, the handling module including a handling motor connected to drive the handling system to move unprocessed micro devices from the input feeder mechanism to the processing mechanism to the output buffer mechanism;

a processing module connected to the processing mechanism, the processing module for processing unprocessed micro devices moved thereto into processed micro devices;

a logic module connected to the input feeder, buffer, buffer sensor, handling, and processing modules, the logic module responsive to the buffer sensor sensing the absence of a processed micro device at the delivery point to cause:

the input feeder motor to drive the input feeder mechanism to feed the unprocessed micro devices, the buffer motor to drive the output buffer mechanism to output processed micro devices, the handling motor to drive the handling system to move the unprocessed micro devices from the input feeder mechanism to the processing module, the processing module to process unprocessed micro devices moved to the processing mechanism to become processed micro devices, the handling motor to drive the handling system to move the processed micro devices from the processing mechanism to the output buffer mechanism, and the buffer motor to drive the output buffer mechanism to move processed micro devices to the delivery point whereby a processed micro device is replaced when a processed micro device is removed from the output buffer mechanism.

12. The electronic system as claimed in claim 11 wherein:
the logic module is responsive to a device sensor in the buffer sensor sensing the absence of a processed micro device in the output buffer mechanism to cause the buffer motor to drive the output buffer mechanism to move processed micro devices to the delivery point a distance which varies with the size of the processed micro devices.

13. The electronic system as claimed in claim 11 wherein:
the logic module is responsive to a speed sensor in the buffer sensor sensing the approach of a processed micro device to the delivery point in the output buffer mechanism to cause the buffer motor to slow the output buffer mechanism to decelerate the processed micro devices.

14. The electronic system as claimed in claim 11 wherein:
the logic module is responsive to the buffer sensor sensing the absence of a predetermined plurality of processed micro devices in the output buffer mechanism to cause:

the input feeder motor to drive the input feeder mechanism to feed a plurality of unprocessed micro devices, the handling motor to drive the handling system to move the plurality of unprocessed micro devices from the input feeder mechanism to the processing module, the processing module to process the plurality of unprocessed micro devices moved to the processing mechanism, and the handling motor to drive the handling system to move the plurality of processed micro devices from the processing mechanism to the output buffer mechanism whereby the processed micro devices in the output buffer mechanism are buffered.

15. The electronic system as claimed in claim 11 wherein:
the handling system includes a linear stage for moving unprocessed and processed micro devices linearly and a vertical pneumatic stage for moving unprocessed and processed micro devices vertically;

the handling module includes the handling motor to drive the linear stage and a pneumatic control section to drive the vertical pneumatic stage; and the logic module causes the handling module to causes the handling system to vertically move the unprocessed micro devices from the input feeder mechanism and linearly to the processing mechanism, vertically into the processing mechanism, and move the processed micro devices vertically out of the processing mechanism and linearly to the output buffer mechanism, and vertically into the output buffer mechanism.

16. The electronic system as claimed in claim 15 wherein:
the handling module includes the handling motor to drive the linear stage and handling system sensors connected to the logic module for determining the range of the drive of the linear stage.

17. The electronic system as claimed in claim 11 wherein:
the processing mechanism includes:
a socket for insertion of unprocessed micro devices, and
a socket actuator for holding unprocessed micro devices in the socket during processing and releasing processed micro devices after processing;

the processing module includes processing to process the unprocessed micro devices in the socket; and the logic module causes the socket actuator to hold and release the unprocessed and processed micro devices, respectively.

18. The electronic system as claimed in claim 11 wherein:
the processing module includes a mechanism for determining when an unprocessed micro device is not processed;

the logic module responsive to an unprocessed micro device not being processed to cause said handling system to eject the unprocessed micro device from the processing mechanism; and the logic module having reject sensors to determine that the unprocessed micro device has been ejected.

19. The electronic system as claimed in claim 11 including:
a user interface for controlling the logic module.

20. The electronic system as claimed in claim 11 including:
a source of electrical power operatively connected to power the input feeder, buffer, handling, processing, and logic modules, and the buffer sensor.

21. An electronic system for a feeder/programming/buffer system having an input feeder mechanism for feeding unprogrammed electronic devices, a programming mechanism for programming unprogrammed electronic devices, an output buffer mechanism for outputting programmed electronic devices to a delivery point, and a handling system for moving electronic devices from the input feeder mechanism to the programming mechanism to the output buffer mechanism, comprising:

- an input feeder module connected input feeder mechanism, the input feeder module including a input feeder motor connected to drive the input feeder mechanism to feed the unprogrammed electronic devices;
- a buffer module connected to the output buffer mechanism, the buffer module including a buffer motor connected to drive the output buffer mechanism to output programmed electronic devices;
- a buffer sensor connected to the output buffer mechanism to sense programmed electronic devices at the delivery point;
- a handling module connected to the handling system, the handling module including a handling motor connected to drive the handling system to move unprogrammed electronic devices from the input feeder mechanism to the programming mechanism to the output buffer mechanism;
- a programming module connected to the programming mechanism, the programming module for programming unprogrammed electronic devices moved thereto into programmed electronic devices;
- a logic function module connected to the input feeder, buffer, buffer sensor, handling, and programming modules, the logic function module responsive to the buffer sensor sensing the absence of a programmed electronic device at the delivery point to cause:
  - the input feeder motor to drive the input feeder mechanism to feed the unprogrammed electronic devices,
  - the buffer motor to drive the output buffer mechanism to output programmed electronic devices,
  - the handling motor to drive the handling system to move the unprogrammed electronic devices from the input feeder mechanism to the programming module,
  - the programming module to process unprogrammed electronic devices moved to the programming mechanism to become programmed electronic devices,
  - the handling motor to drive the handling system to move the programmed electronic devices from the programming mechanism to the output buffer mechanism, and
  - the buffer motor to drive the output buffer mechanism to move programmed electronic devices to the delivery point whereby a programmed electronic device is replaced when a programmed electronic device is removed from the output buffer mechanism.

22. The electronic system as claimed in claim 21 wherein:
the logic function module is responsive to a device sensor in the buffer sensor sensing the absence of a programmed electronic device in the output buffer mechanism to cause the buffer motor to drive the output buffer mechanism to move programmed electronic devices to the delivery point a distance which varies with the size of the programmed electronic devices.

23. The electronic system as claimed in claim 21 wherein:
the logic function module is responsive to a speed sensor in the buffer sensor sensing the approach of a programmed electronic device to the delivery point in the output buffer mechanism to cause the buffer motor to slow the output buffer mechanism to decelerate the programmed electronic devices.

24. The electronic system as claimed in claim 21 wherein:
the logic function module is responsive to the buffer sensor sensing the absence of a predetermined plurality of programmed electronic devices in the output buffer mechanism to cause:
  - the input feeder motor to drive the input feeder mechanism to feed a plurality of unprogrammed electronic devices,
  - the handling motor to drive the handling system to move the plurality of unprogrammed electronic devices from the input feeder mechanism to the programming module,
  - the programming module to process the plurality of unprogrammed electronic devices moved to the programming mechanism, and
  - the handling motor to drive the handling system to move the plurality of programmed electronic devices from the programming mechanism to the output buffer mechanism whereby the programmed electronic devices in the output buffer mechanism are buffered.

25. The electronic system as claimed in claim 21 wherein:
the handling system includes a horizontal linear stage for moving unprogrammed and programmed electronic devices linearly and a vertical pneumatic stage for moving unprogrammed and programmed electronic devices vertically;
the handling module includes the handling motor to drive the linear stage and a pneumatic control section to drive the vertical pneumatic stage; and
the logic function module causes the handling module to causes the handling system to vertically move the unprogrammed electronic devices from the input feeder mechanism and linearly to the programming mechanism, vertically into the programming mechanism, and move the programmed electronic devices vertically out of the programming mechanism and linearly to the output buffer mechanism, and vertically into the output buffer mechanism.

26. The electronic system as claimed in claim 25 wherein:
the handling module includes the handling motor to drive the linear stage and handling system sensors connected to the logic function module for determining the range of the drive of the linear stage.

27. The electronic system as claimed in claim 21 wherein:
the programming mechanism includes:
  - a socket for insertion of unprogrammed electronic devices, and
  - a socket actuator for holding unprogrammed electronic devices in the socket during programming and releasing programmed electronic devices after programming;
the programming module includes programming to process the unprogrammed electronic devices in the socket; and
the logic function module causes the socket actuator to hold and release the unprogrammed and programmed electronic devices, respectively.

28. The electronic system as claimed in claim 21 wherein:
the programming module includes a mechanism for determining when an unprogrammed electronic device is not programmed;

the logic function module responsive to an unprogrammed electronic device not being programmed to cause said handling system to eject the unprogrammed electronic device from the programming mechanism; and the logic function module having reject sensors to determine that the unprogrammed electronic device has been ejected.

29. The electronic system as claimed in claim 21 including:

a source of electrical power operatively connected to power the input feeder, buffer, handling, programming, and logic function modules.

30. The electronic system as claimed in claim 21 including:

a source of low voltage electrical power operatively connected to power the input feeder, buffer, handling, programming, and logic function modules, and the buffer sensor.

* * * * *